United States Patent
Chellappa

(10) Patent No.: US 7,821,307 B2
(45) Date of Patent: Oct. 26, 2010

(54) BANDGAP REFERENCED POWER ON RESET (POR) CIRCUIT WITH IMPROVED AREA AND POWER PERFORMANCE

(75) Inventor: Ananthasayanam Chellappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 12/343,326

(22) Filed: Dec. 23, 2008

(65) Prior Publication Data

US 2010/0156477 A1    Jun. 24, 2010

(51) Int. Cl.
H03L 7/00    (2006.01)

(52) U.S. Cl. .................................. 327/143; 327/142

(58) Field of Classification Search .................. 327/142, 327/143, 198
See application file for complete search history.

(56) References Cited

U.S. PATENT DOCUMENTS 7,190,212 B2 *   3/2007   Shor et al. ................... 327/539
7,411,443 B2     8/2008   Ivanov et al.

\* cited by examiner

*Primary Examiner*—Lincoln Donovan
*Assistant Examiner*—Daniel Rojas
(74) *Attorney, Agent, or Firm*—William B. Kempler; Wade J. Brady, III; Frederick J. Telecky, Jr.

(57) ABSTRACT

In an apparatus for monitoring a supply voltage, a current mirror coupled to the supply voltage provides a pair of matching currents. A resistor divider that includes a first resistor coupled in series with a second resistor to from a first node is disposed between the supply voltage and a voltage reference. A pair of transistors that have their bases coupled to the first node are coupled to receive a corresponding one of the pair of matching currents. A collector of a first transistor of the pair of transistors provides an output voltage in response to the supply voltage. A third resistor is disposed between an emitter of a second transistor of the pair of transistors and the voltage reference. A base and a collector of a third transistor are coupled to the first node and an emitter is coupled to the voltage reference.

20 Claims, 13 Drawing Sheets

| 262-264 COMMON BASE VOLTAGE | 0.621 VOLTS |
|---|---|
| VOLTAGE ACROSS 270 | 0.0467 VOLTS |
| 280 STATUS | CURRENT THRU' 280 IS 1.155 MICROA |
| 222 VOLTAGE | 1 VOLT |
| 262-264 CURRENT | I 262 = I 264 |
| 212 VOLTAGE | 2.441 VOLTS |

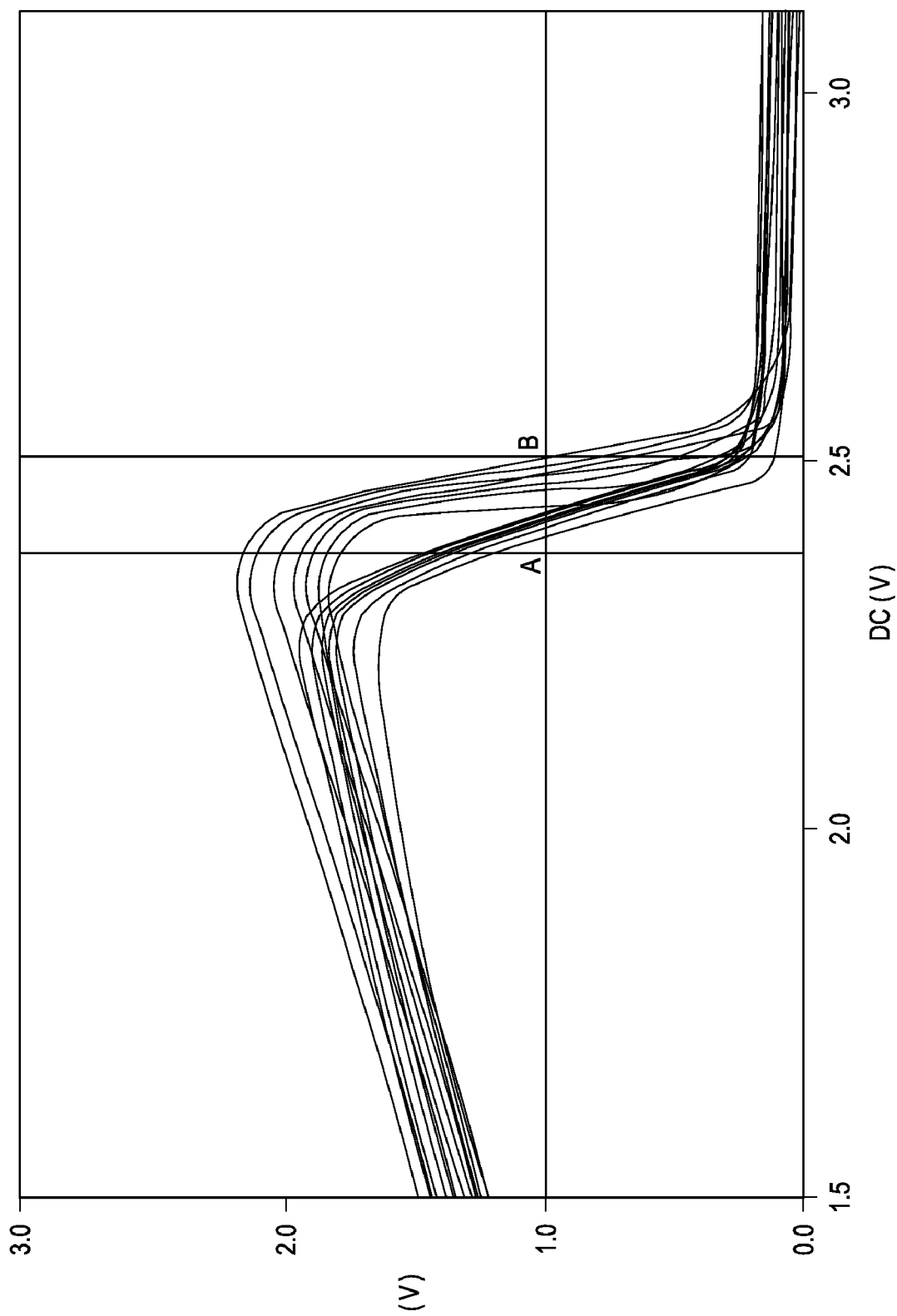

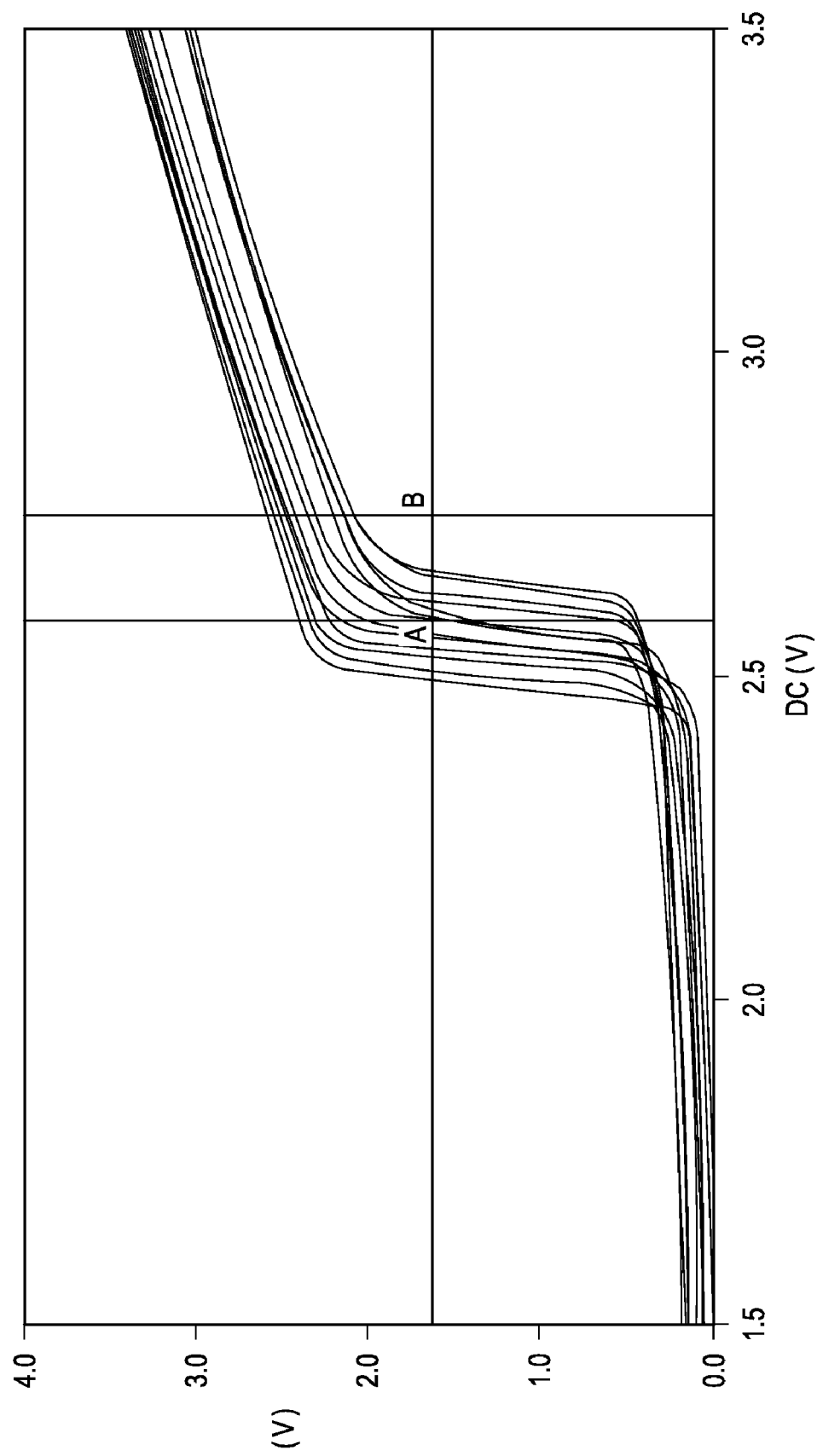

BANDGAP REFERENCED POWER ON RESET (POR) CIRCUIT WITH IMPROVED AREA AND POWER PERFORMANCE

BACKGROUND

The present disclosure relates generally to electronic circuits, and more particularly to an apparatus for detecting a power on condition utilizing a bandgap (BG) reference.

It is well known that electronic devices such as personal computers, televisions, digital cameras, personal entertainment devices, cellular phones, and similar others incorporate semiconductor integrated circuit (IC) chips, which are designed to operate at various power, voltage, and temperature levels. Many electronic devices use bandgap reference circuits that provide an accurate and reliable voltage reference that is stable over a wide operating temperature range. FIG. 1A is a diagram of a BG reference circuit 110, according to prior art. Differing current densities between matched transistors Q1-Q2 produces a delta Vbe voltage across resistor R3. An output bandgap reference voltage is generated by adding voltages across Q3 with the amplified delta Vbe voltage to produce a temperature invariant voltage reference.

During the startup and shutdown of these electronic devices the IC chips may enter an indeterminate operating state due to the unpredictable power supply voltages occurring during the startup and shutdown. For example, most IC chips require that a power supply provide a desired operating voltage before the IC chips are enabled to perform normal operation. Use of a power on reset (POR) circuit (which may also be referred to as a power on sense or a power on detection circuit) to insure presence of sufficient supply voltage is well known. The POR circuit senses a power on condition when a power supply voltage exceeds a desired trigger or threshold voltage level and provides a reset signal as an output that may be used to reset the IC chips to a known operating condition. The POR circuit may also be configured to detect abnormal operating conditions of the power supply including a brown out condition when a voltage level drops below the threshold.

The band gap of silicon at 300 K temperature is approximately 1.12 electron volts (eV) and for germanium it is 0.66 eV. The principle behind the bandgap reference is the well known voltage drop associated with certain semiconductor junctions. For example, a silicon p-n junction such as the emitter-base junction of a bipolar junction transistor (BJT) may have a forward conduction characteristic, e.g., a voltage drop of about 0.6 volts. It may be possible to construct a basic voltage reference circuit based on this known physical conduction property. For example, one or more such p-n junctions may be connected in series to form a voltage reference circuit that has a predetermined and stable output voltage such as by connecting two silicon diodes in series provides a regulated 1.2 volt output, by connecting three silicon diodes connected in series provide a regulated 1.8 volt output, and similar others. However, the voltage constructed by stacking diode voltages will not be temperature independent since it decreases with temperature, e.g., is complementary to absolute temperature (CTAT). As described earlier, the bandgap reference circuit 110 is typically designed to add voltages generated by a CTAT device to a proportional to absolute temperature (PTAT) device to obtain a voltage reference that is temperature invariant.

A voltage output of a conventional BG reference circuit is about 1.2 volts. FIG. 1B is a diagram of a BG referenced circuit referred to as a 'Brokaw cell' based POR circuit (BPOR) 100 according to prior art. The BPOR 100 deploys a total of 4 resistors (2 matched pairs) to provide a trip point for a supply voltage greater than 1.2 volts, the trip point voltage being adjusted by adjusting a ratio between two of the four resistors. However, the BPOR 100 consumes greater power and requires additional silicon area compared to the conventional BG referenced POR circuit that provides a trip point for a supply voltage of less than or equal to 1.2 volts. Therefore, a need exists to provide an apparatus for detecting a power on condition based on a BG reference that can provide a voltage output that changes in response to a supply voltage that is greater than 1.2 volts and preferably provide an improvement in power and silicon area compared to the BPOR 100.

SUMMARY

The foregoing needs are addressed by the teachings of the present disclosure, which relates to an apparatus for monitoring voltage levels. According to one embodiment, an apparatus for monitoring a supply voltage includes a current mirror coupled to the supply voltage and operable to provide a pair of matching currents. A resistor divider that includes a first resistor coupled in series with a second resistor to from a first node is disposed between the supply voltage and a voltage reference. A pair of transistors that have their bases coupled to the first node are coupled to receive a corresponding one of the pair of matching currents. A collector of a first transistor of the pair of transistors provides an output voltage in response to the supply voltage. A third resistor is disposed between an emitter of a second transistor of the pair of transistors and the voltage reference. A base and a collector of a third transistor are coupled to the first node and an emitter is coupled to the voltage reference.

In one aspect of the disclosure, an electronic system includes a power supply operable to provide a supply voltage, a power on reset circuit (POR) for monitoring the supply voltage and providing an output voltage in response to the supply voltage, and an electronic device that is enabled to receive the supply voltage in response to a change of state of the output voltage. According to one embodiment, the POR circuit includes a current mirror coupled to the supply voltage and operable to provide a pair of matching currents. A resistor divider that includes a first resistor coupled in series with a second resistor to from a first node is disposed between the supply voltage and a voltage reference. A pair of transistors that have their bases coupled to the first node are coupled to receive a corresponding one of the pair of matching currents. A collector of a first transistor of the pair of transistors provides the output voltage in response to the supply voltage. A third resistor is disposed between an emitter of a second transistor of the pair of transistors and the voltage reference. A base and a collector of a third transistor are coupled to the first node and an emitter is coupled to the voltage reference.

Several advantages are achieved by the system according to the illustrative embodiments presented herein. The embodiments advantageously provide an improved POR circuit that deploys 3 resistors compared to the 4 resistors included in a traditional BPOR. The improved POR circuit advantageously provides tradeoffs between power consumption and silicon area compared to the traditional BPOR. The current consumption of the improved POR circuit that is optimized for reduced current is 25% lower compared to a current consumption of a BPOR, with the POR circuit and the BPOR being configured to have a common desired trip point voltage. For a desired trip point voltage and a desired current consumption by the POR circuit, a silicon area of the improved POR circuit is smaller than a comparable silicon area for a BPOR having the same desired trip point voltage and the desired current consumption.

BRIEF DESCRIPTION OF THE DRAWINGS

FIG. 4C illustrates in graphical form process and component mismatch variance data for a POR circuit at different temperatures, according to an embodiment;

FIG. 4D illustrates in graphical form process and component mismatch variance data for a traditional BPOR at different temperatures;

DETAILED DESCRIPTION

Figure 1A:
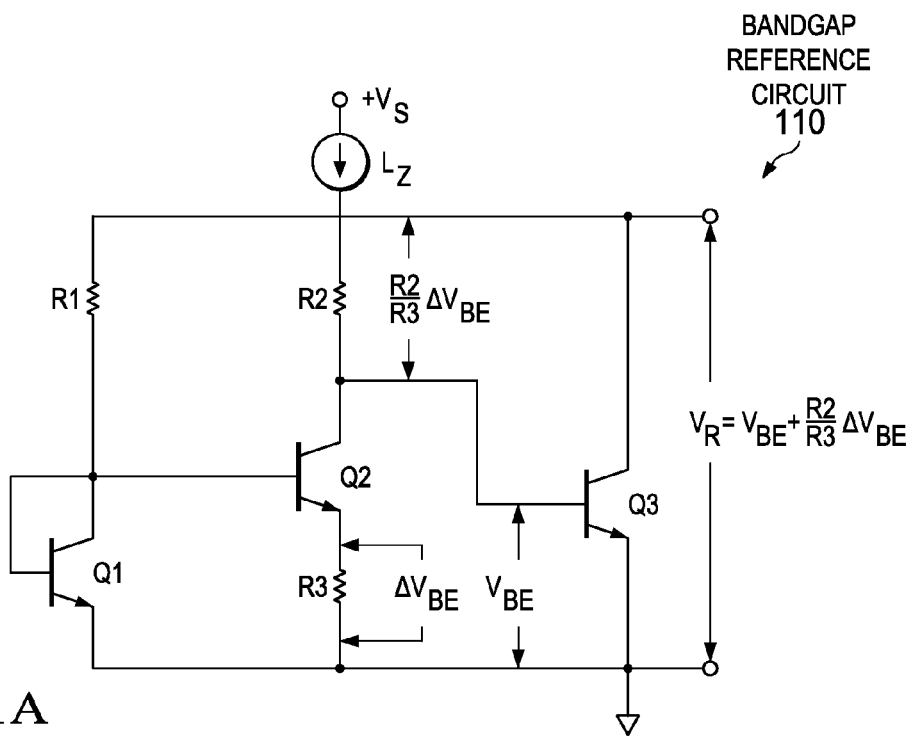
FIG. 1A is a diagram of a BG reference circuit, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

A voltage output of a conventional BG reference circuit is about 1.2 volts, which is approximately the band gap of silicon. A traditional BPOR deploys a total of 4 resistors (2 matched pairs) to provide a trip point for a supply voltage greater than 1.2 volts, the trip point voltage being adjusted by adjusting a ratio between two of the four resistors. However, the BPOR consumes greater power and requires additional silicon area compared to the conventional BG reference circuit. Therefore, a need exists to provide an apparatus for detecting a power on condition based on a BG reference that can provide a change in a voltage output when the supply voltage (that is greater than 1.2 volts) exceeds a desired threshold and preferably provide an improvement in power and silicon area compared to the BPOR. This problem may be addressed by an improved apparatus for monitoring supply voltage levels.

According to one embodiment, an apparatus for monitoring a supply voltage includes a current mirror that is coupled to the supply voltage and operable to provide a pair of matching currents. A resistor divider that includes a first resistor coupled in series with a second resistor to from a first node is disposed between the supply voltage and a voltage reference. A pair of transistors that have their bases coupled to the first node are coupled to receive a corresponding one of the pair of matching currents. A collector of a first transistor of the pair of transistors provides an output voltage in response to the supply voltage. A third resistor is disposed between an emitter of a second transistor of the pair of transistors and the voltage reference. A base and a collector of a third transistor are coupled to the first node and an emitter is coupled to the voltage reference.

The following terminology may be useful in understanding the present disclosure. It is to be understood that the terminology described herein is for the purpose of description and should not be regarded as limiting.

Electrical connection and electrical coupling—The term 'connection or connected' refers to a direct electrical connection between the devices or components that are connected, without the presence of any intermediate device(s) or component(s). The term 'coupling or coupled' refers to either a direct electrical connection between the devices or components that are connected or an indirect connection through one or more intermediary device(s) or component(s). The devices or components may be passive or active.

Electrical or electronic circuit—The term 'electrical or electronic circuit' may include one or more components, either active or passive, that are electrically coupled together to provide a desired function.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a pull up resistor may be configured to be equal to 1 mega ohm to enable a voltage output to be held at a high logic level.

System—Interdependent electronic devices or circuits that co-operate to perform one or more desired functions.

An improved electronic system for monitoring supply voltages is described with reference to FIGS. 2A, 2B, 2C, 3A, 3B, 3C, 4A, 4B, 4C, 4D, 5A, 5B, 5C, and 5D.

Figure 2A:
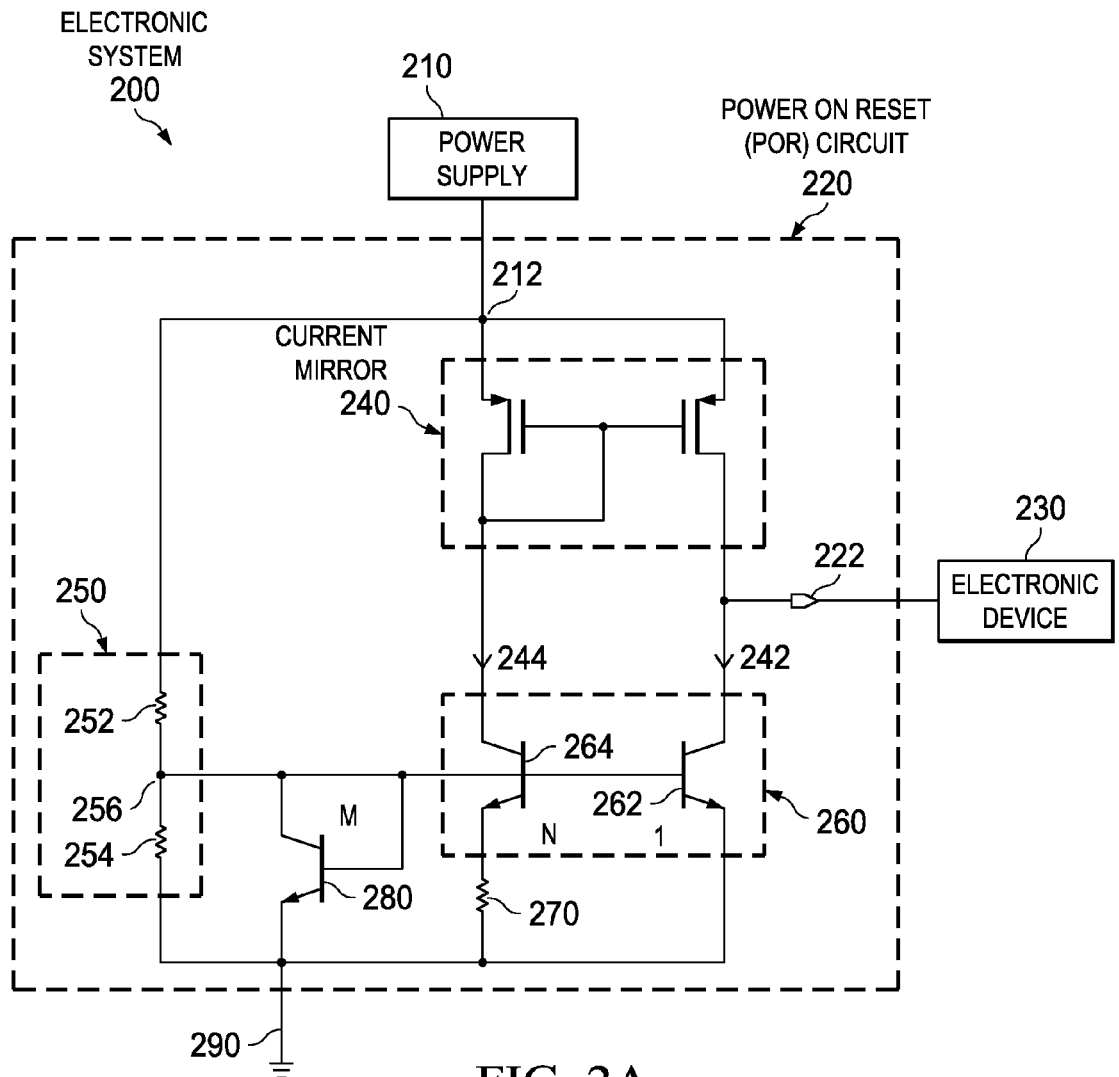
FIG. 2A illustrates a block diagram of an electronic system for monitoring supply voltages, according to an embodiment.

FIG. 2A illustrates a block diagram of an electronic system 200 for monitoring supply voltages, according to an embodiment. The electronic system 200 includes a power supply 210 operable to provide a supply voltage 212 and current to a power on reset (POR) 220 circuit. The POR 220 circuit is operable to monitor the supply voltage 212 and provide an output voltage 222 in response to the supply voltage 212. In a particular embodiment, the output voltage 222 is output as a digital signal, e.g., having a logic high or logic low value. The output voltage 222 may be used to control the flow of power to an electronic device 230. That is, the output voltage 222 may be asserted or deasserted to enable or disable the supply voltage 212 from being provided to the electronic device 230. For example, the POR 220 may be operable to disable the electronic device 230 from receiving the supply voltage 212 if the supply voltage 212 is below a threshold voltage (which may during start up, brown out condition or other abnormal condition) that may be desired for a safe operation of the electronic device 230.

In the depicted embodiment, the POR 220 circuit includes a current mirror 240, a resistor divider circuit 250, a pair of transistors 260, a third resistor 270, and a third transistor 280. The current mirror 240 is connected to the power supply 210 to provide a pair of matching currents 242 and 244. The pair of matching currents 242 and 244 is respectively provided to a first transistor 262 and a second transistor 264 connected back-to-back to form the pair of transistors 260. The function of the current mirror 240 is to force the current in the mirror device, e.g., current 242, to be the same as that of the diode device, e.g., current 244. Hence, in the depicted embodiment, the current mirror 240 has the effect of forcing the current in the first transistor 262 to be the same as that in the second transistor 264. Since the first transistor 262 wants to have a different current, a logic level of the output voltage 222 is adjusted accordingly. In the depicted embodiment, although the current mirror 240 is formed by using a pair of PMOS transistors, it is understood that the current mirror 240 may be configured by using other circuit elements such as NMOS transistors, load resistors, bipolar transistors, field effect transistors, and similar others. Similarly, although the pair of transistors 260 are formed by using a NPN type bipolar junction transistor (BJT), it is understood that the pair of transistors 260 may be configured by using other circuit element types such as PNP type BJT's, CMOS transistors, field effect transistors, and similar others.

The resistor divider circuit 250 is disposed between the supply voltage 212 and a voltage reference 290 such as ground voltage. The resistor divider circuit 250 includes a first resistor 252 disposed between the supply voltage 212 and a first node 256 and a second resistor 254 disposed between the first node 256 and the voltage reference 290. The first node 256 is connected to each one of the bases of the first transistor 262 and the second transistor 264. Thus, a voltage at the first node 256 is indicative of the forward-bias base-to-emitter voltage for the pair of transistors 260. A collector of the first transistor 262 provides the output voltage 222 in response to the supply voltage 212. The third resistor 270 is disposed between an emitter of the second transistor 264 and the voltage reference 290. The third transistor 280 has a base and a collector that is coupled to the first node 256 and an emitter that is coupled to the voltage reference 290.

In the depicted embodiment, the second transistor 264 is configured to have an emitter area that is sized N times the emitter area of the first transistor 262, where N is an integer. In a particular embodiment, the value of N may be typically configured between 2 and 12, e.g., 8, depending on the application. It is understood that selecting a particular value of N is application dependent and should be configured in such a manner that uses a layout of a POR circuit conforming to the best practices for overcoming factors aiding mismatch. Similarly, the third transistor 280 is configured to carry an emitter current that is M times the emitter current of the first transistor 262, where M is an integer. In a particular embodiment, the value of M may be typically configured between 2 and 12, e.g., 8, depending on the application. It is understood that selecting a particular value of M is application dependent and should be configured in such a manner that uses a layout of a POR circuit conforming to the best practices for overcoming factors aiding mismatch.

As the power supply 210 of the electronic system 200 is initially powered on the supply voltages within the system may be unpredictable and the electronic device 230 may be operating in an indeterminate operating state. The POR 220 circuit is configured to disable the electronic device 230 from receiving the supply voltage 212, e.g., by asserting or deasserting the output voltage 222, until the supply voltage 212 reaches a desired value that may be required for normal operation. During the initial power on transition period, the supply voltage 212 ramps up from 0 volts to a desired voltage VDC. The transition from an initial voltage level to a desired voltage typically occurs within a short period of time such as a few microseconds. It is understood that the transition time for the power supply to attain a desired voltage level is application dependent and may vary from a few nanoseconds to several milliseconds. During the transition period, the POR 220 circuit monitors the supply voltage 212 to determine whether the supply voltage 212 is below, equal to, or above a threshold level and adjusts the output voltage 222 accordingly. Thus, the output voltage 222 changes state, e.g., from a logic high level to a logic low level, in response to the supply voltage 212 being below or above the threshold level. The threshold level may be dependent on the bandgap referenced voltage. That is, the threshold level at which the output voltage 222 trips or changes state may be configured to be equal to the bandgap reference voltage, or a multiple thereof.

Figure 3A:
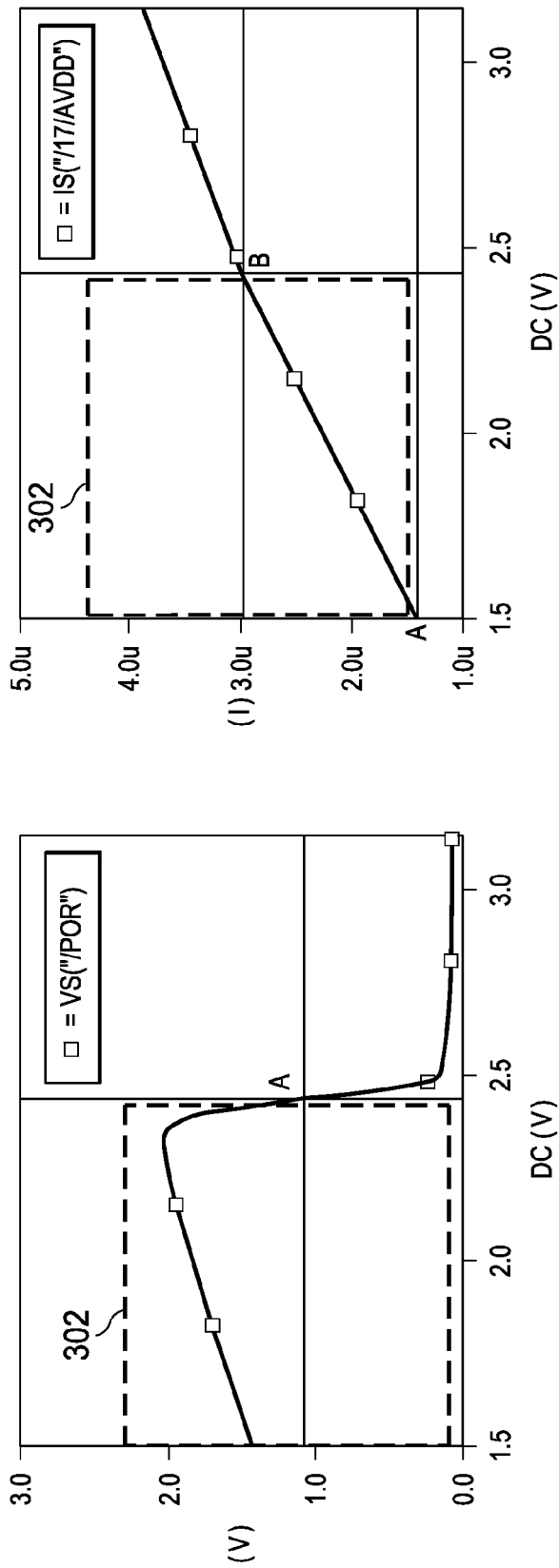
FIG. 3A includes current and voltage data illustrated in tabular and graphical form for a POR circuit operating in a pre-trip condition, according to an embodiment, according to an embodiment.
Figure 3B:
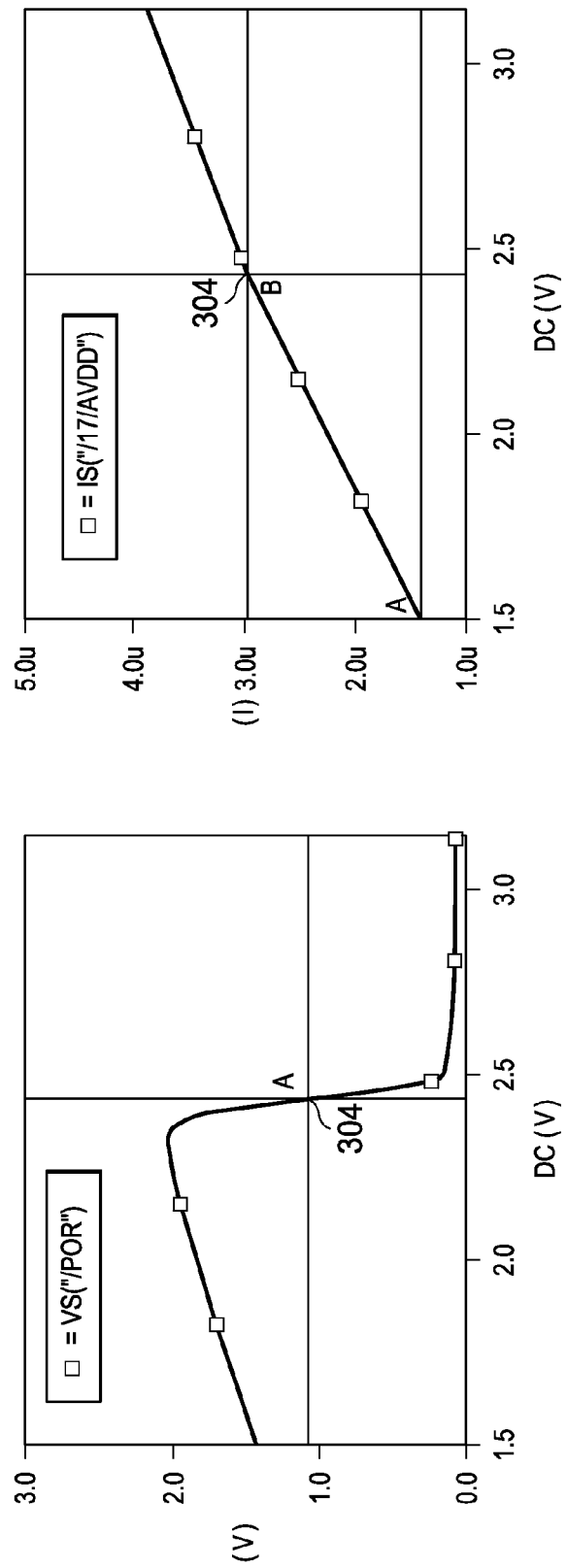
FIG. 3B includes current and voltage data illustrated in tabular and graphical form for a POR circuit operating at a trip point, according to an embodiment.
Figure 3C:
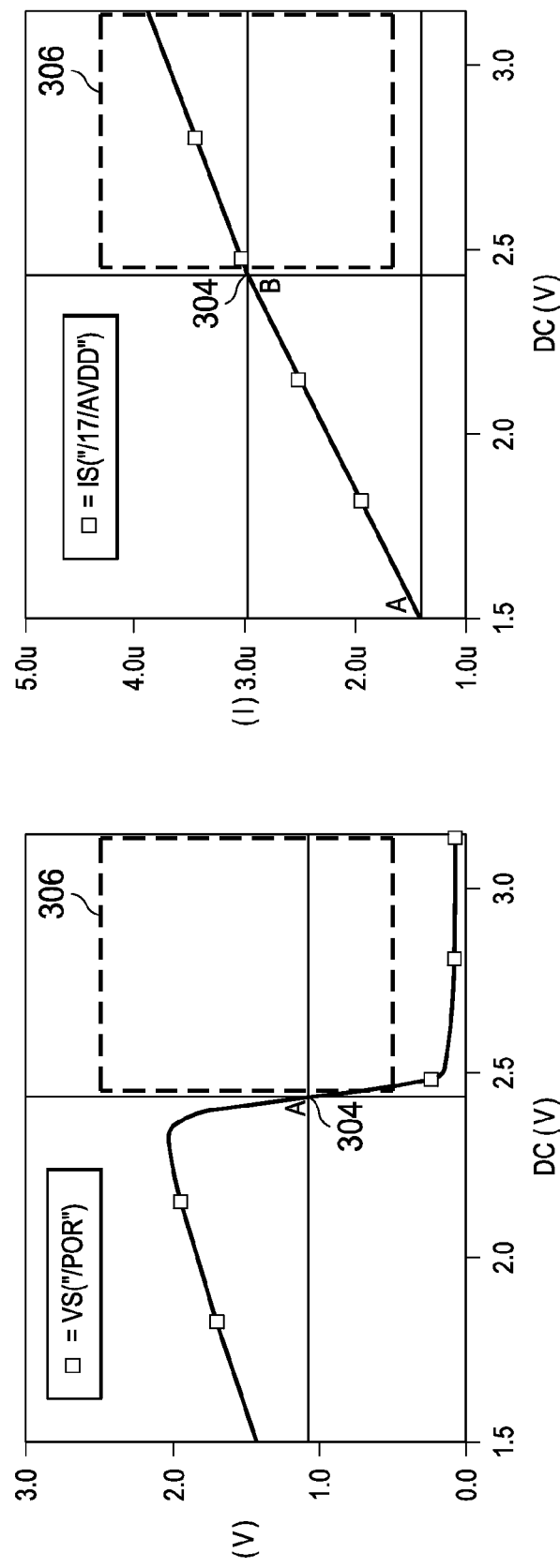
FIG. 3C includes current and voltage data illustrated in tabular and graphical form for a POR circuit operating in a post-trip condition, according to an embodiment.

The period of transition for the supply voltage 212 from 0 volts to a desired voltage may be split into a pre-trip operating condition, a trip condition, and a post-trip operating condition for the POR 220 circuit. At the trip point, the currents in the first transistor 262 and the second transistor 264 are equal. Therefore, desired trip point values may be computed based this condition. When operating in the pre-trip and post-trip condition, the currents in the first transistor 262 and the second transistor 264 are different, and hence, the output voltage 222 is different (e.g., is high or low) on account of the currents needing to be physically equal in the output voltage generating arm of the circuit. Additional details of the POR 220 circuit operating in pre-trip, at trip point, and post-trip condition are described with reference to FIGS. 3A, 3B, and 3C. The POR 220 circuit may also be configured to detect abnormal operating conditions of the power supply 210 including a brown out condition when the supply voltage 212 level drops below the threshold after reaching a desired voltage level. It is understood that the POR 220 circuit may be configured to have different values for circuit parameters such as the first, second, and third resistors, trip points, N and M values, and similar others to optimize one or more performance criteria such as current consumption, silicon area, temperature variance and similar others. That is, particular values for the POR 220 circuit may be selected to optimize one or more performance criteria set for a particular application. FIGS. 3A, 3B, and 3C illustrate the POR 220 circuit implemented using one set of component values to concurrently optimize temperature variation, silicon area, and current consumption compared to the BPOR 100 circuit.

Figure 2B:
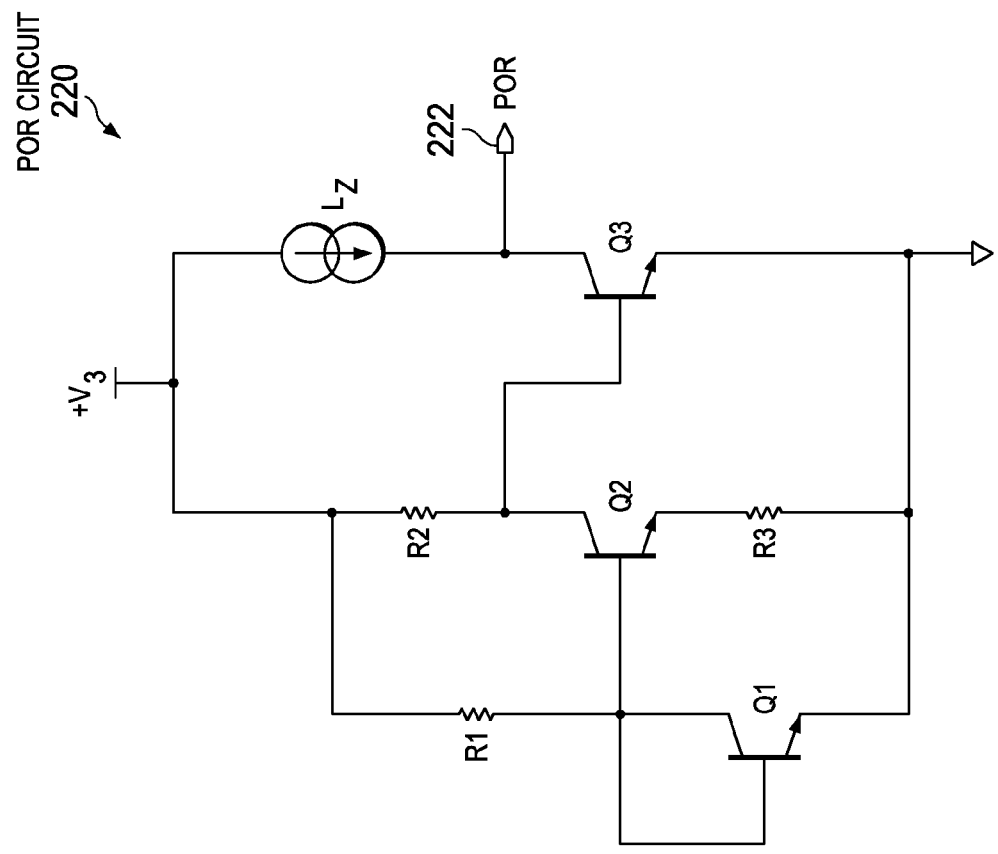
FIG. 2B illustrates a technique for constructing a POR circuit from a bandgap reference circuit described with reference to FIG. 1A, according to an embodiment.
Figure 2B:
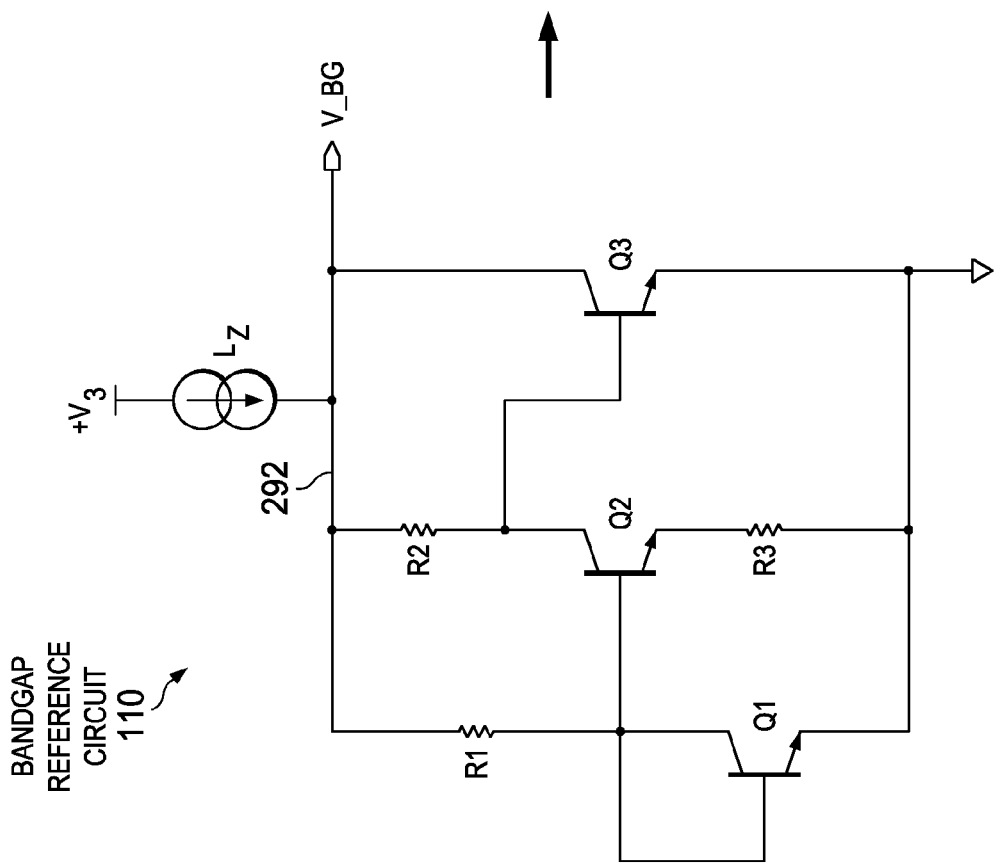
Figure 2C:
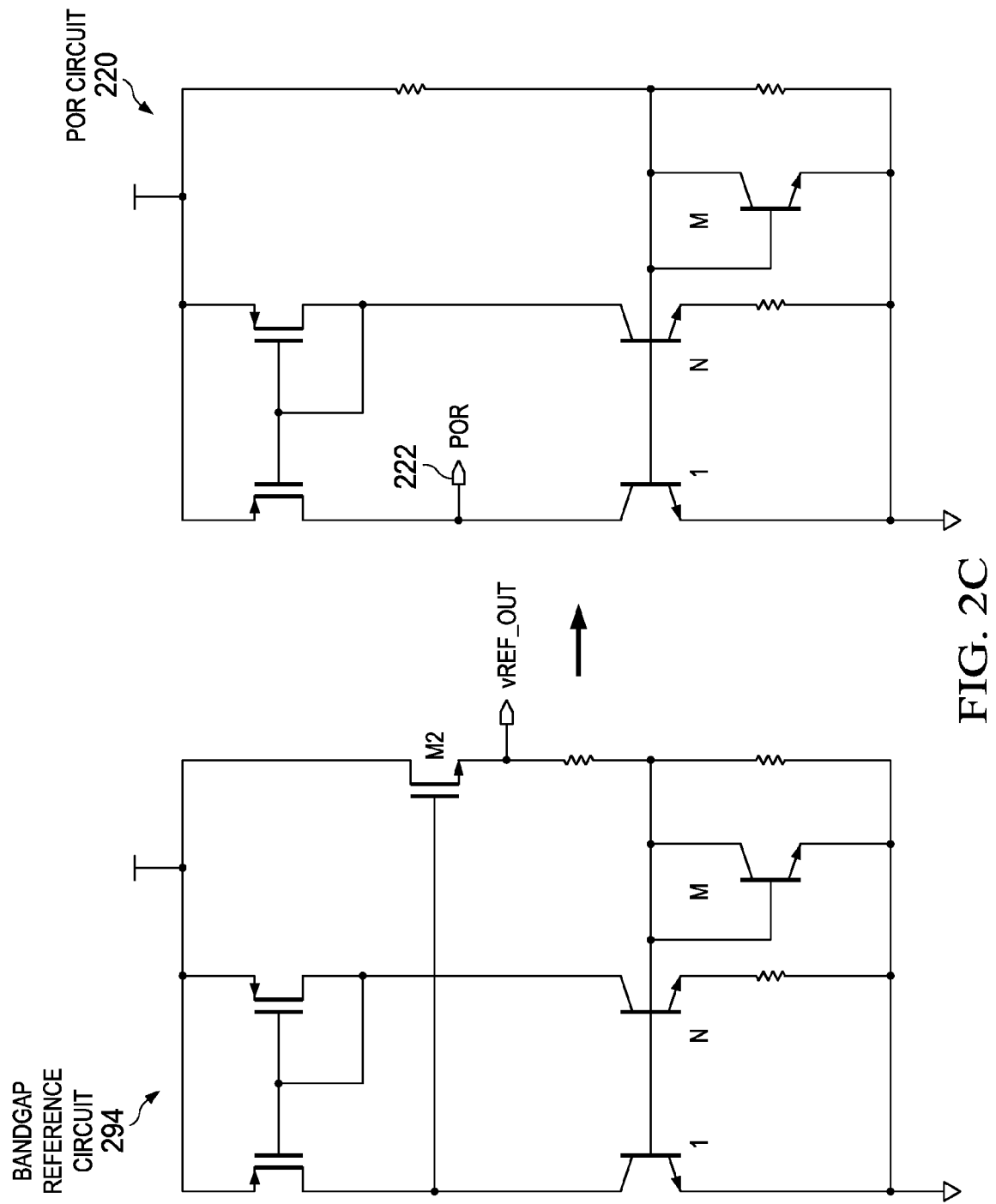
FIG. 2C illustrates another technique for constructing a POR circuit from a bandgap reference circuit, according to an embodiment.

FIGS. 2B and 2C illustrate techniques for constructing a POR circuit from bandgap reference circuits, according to an embodiment. Referring to FIG. 2B, the POR 220 circuit may be constructed from the traditional bandgap reference circuit 110 described with reference to FIG. 1A having an output voltage as the desired trip point as a starting point, and then reconfiguring it as the POR circuit 220. To convert the bandgap reference circuit 110 to the POR 220 circuit, a bandgap reference circuit where the bandgap is obtained at a low-impedance point is selected. In this particular case, to realize a POR circuit, a middle horizontal branch 292 in the output voltage net at the top of the circuit is cut, and the current source is connected to the collector of Q3 and Vs is connected to the node common to R1 and R2. Now Q3's collector provides the POR output 222. In general, a node where the reference voltage (which may be higher than the bandgap voltage) is available may be used as the break point. The downstream portion of the circuit terminating at that node may be tied to the input supply voltage and the upstream portion of the circuit now has the POR output. Referring to FIG. 2C, the POR 220 circuit may be constructed by assembling another bandgap reference circuit 294 having an output voltage as the desired trip point as a starting point, and then reconfiguring it as the POR circuit 220. In the bandgap reference circuit 294, a reference voltage is obtained at the input of a resistor divider. To construct the POR 220 from the bandgap reference circuit 294, the input of the resistor divider is tied to the supply voltage and the node where the resistor divider was previously connected now has the POR output 222.

FIG. 3A includes current and voltage data illustrated in tabular and graphical form for the POR 220 circuit operating in a pre-trip 302 region, according to an embodiment. The data included in a table 310 and graphs 320 are computed using various techniques including use of testing, empirical, simulation tools, and similar others. In a particular embodiment, components of the POR 220 circuit are configured to have the following values: third resistor=79 kilo ohms, first and second resistors each=1 mega ohms, typical supply voltage=1.5 volts, N=8, and M=2. The configured values for the POR 220 circuit provide the desired circuit performance such as power consumption, silicon area, output voltage level, and temperature invariance over the desired temperature range.

As the supply voltage 212 ramps from 0 volts to about 2.2 volts, the emitter of the second transistor 264 carries about 8× the emitter current of the first transistor 262. The voltage at the first node 256 increases to about 0.587 volts, which is still below the onset voltage of about 0.6 volts for full conduction. The output voltage 222 is at a first voltage level that is equal to about 1.43 volts. The voltage across the third resistor 270 is about 0.0267 volts and the third transistor 280 is virtually non-conducting due to the first node 256 being at 0.587 volts.

FIG. 3B includes current and voltage data illustrated in tabular and graphical form for the POR 220 circuit operating at a trip point 304, according to an embodiment. The data included in a table 330 and graphs 340 are computed using various techniques including use of testing, empirical, simulation tools, and similar others. In a particular embodiment, components of the POR 220 circuit are configured to have the following values: third resistor=79 kilo ohms, first and second resistors each=1 mega ohm, typical supply voltage at trip point=2.441 volts, N=8, and M=2. The configured values for the POR 220 circuit provide the desired circuit performance such as power consumption, silicon area, output voltage level, and temperature invariance over the desired temperature range.

As the supply voltage 212 ramps above 2.2 volts and approaches the threshold value of 2.4 volts, the POR 220 circuit trips. At the trip point 304, the emitter of the second transistor 264 carries about the same current as the emitter current of the first transistor 262. The voltage at the first node 256 increases to about 0.621 volts, which is just equal to the onset voltage of about 0.6 volts for full conduction of the third transistor 280. The output voltage 222 is at a second voltage level that is equal to about 1 volt. The voltage across the third resistor 270 is about 0.0467 volts and the third transistor 280 is fully conducting due to the first node 256 being at 0.621 volts. Since the third transistor 280 starts conducting at the trip point 304, current between the first node 256 and the voltage reference 290 is split between three parallel paths in proportion to the resistance in each path. Therefore, the third transistor 280 carries significantly higher current compared to the current flowing through the second resistor 254 and the third resistor 270.

In a particular embodiment, since the currents flowing through the first transistor 242 and the second transistor 244 are equal, the output voltage 222 at the trip point 304 is computed as a function of the first resistor 252, the second resistor 254, the third resistor 270, the value of M, and a difference between base-to-emitter voltage of the first transistor 262 and the second transistor 264. Specifically, the output voltage 222 at the trip point is defined by Equation 100.

$$Vtrip = (1+R2/R1)*[Vbe+M*Vptat*(R1 \| R2)/R3] \quad \text{Equation 100}$$

where Vtrip=the output voltage, R2=first resistor 252, R1=second resistor 254, R3=third resistor 270, Vbe=base-to-emitter voltage, and Vptat=(k*T/q) ln N where k is Boltzmann's constant, N as described earlier is the ratio between core BJT's, q is electron charge, and T is the absolute temperature. Thus, the values of R1, R2, and R3 may be configured to obtain a desired trip point. At the trip point 304, the function of the third transistor is to provide PTAT current. As described earlier, both the 242 and 244 BJT's carry equal current because of the current mirror 240. This condition may be used to work backwards to find that that current is equal to VPTAT/R3 and so the third transistor 280 carries PTAT current.

FIG. 3C includes current and voltage data illustrated in tabular and graphical form for the POR 220 circuit operating in a post-trip region 306, according to an embodiment. The data included in a table 350 and a graph 360 is computed using various techniques including use of testing, empirical, simulation tools, and similar others. In a particular embodiment, components of the POR 220 circuit are configured to have the following values: third resistor=79 kilo ohms, first and second resistors each=1 mega ohms, typical supply voltage (post-trip)=3 volts, N=8, and M=2. The configured values for the POR 220 circuit provide the desired circuit performance such as power consumption, silicon area, output voltage level, and temperature invariance over the desired temperature range.

As the supply voltage 212 ramps above the trip voltage of 2.4 volts and approaches the desired value of 3 volts for safe operation of the electronic device 230, the POR 220 circuit changes the value of the output voltage 222. At an exemplary point in the post-trip 306 region, the emitter of the second transistor 264 carries less current compared to the emitter current of the first transistor 262. The voltage at the first node 256 increases to about 0.631 volts, which is above the onset voltage of about 0.6 volts for full conduction of the third transistor 280. The output voltage 222 is at a third voltage level that is equal to about 0.075 volt. The voltage across the third resistor 270 is about 0.0532 volts and the third transistor 280 is fully conducting due to the first node 256 being at 0.631 volts. Since the third transistor 280 is fully conducting, current between the first node 256 and the voltage reference 290 is split between three parallel paths in proportion to the resistance in each path. Therefore, the third transistor 280 carries significantly higher current compared to the current flowing through the second resistor 254 and the third resistor 270.

Figure 4A:
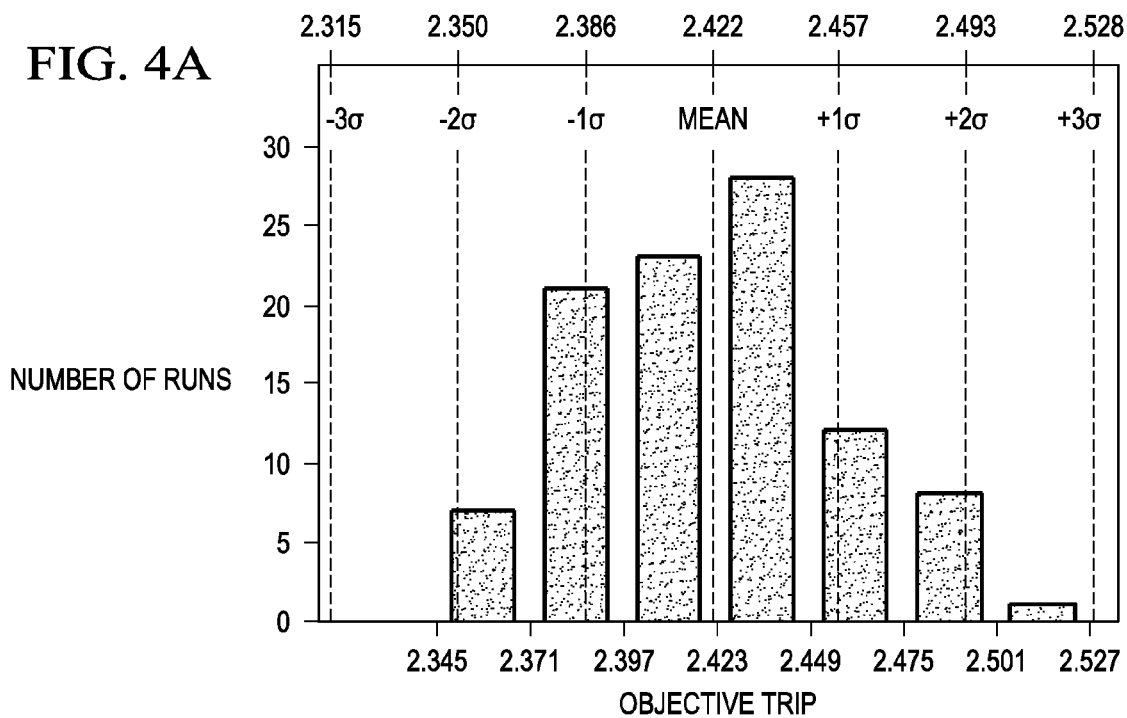
FIG. 4A illustrate in graphical form process and temperature variance data for a POR circuit, according to an embodiment.
Figure 4B:
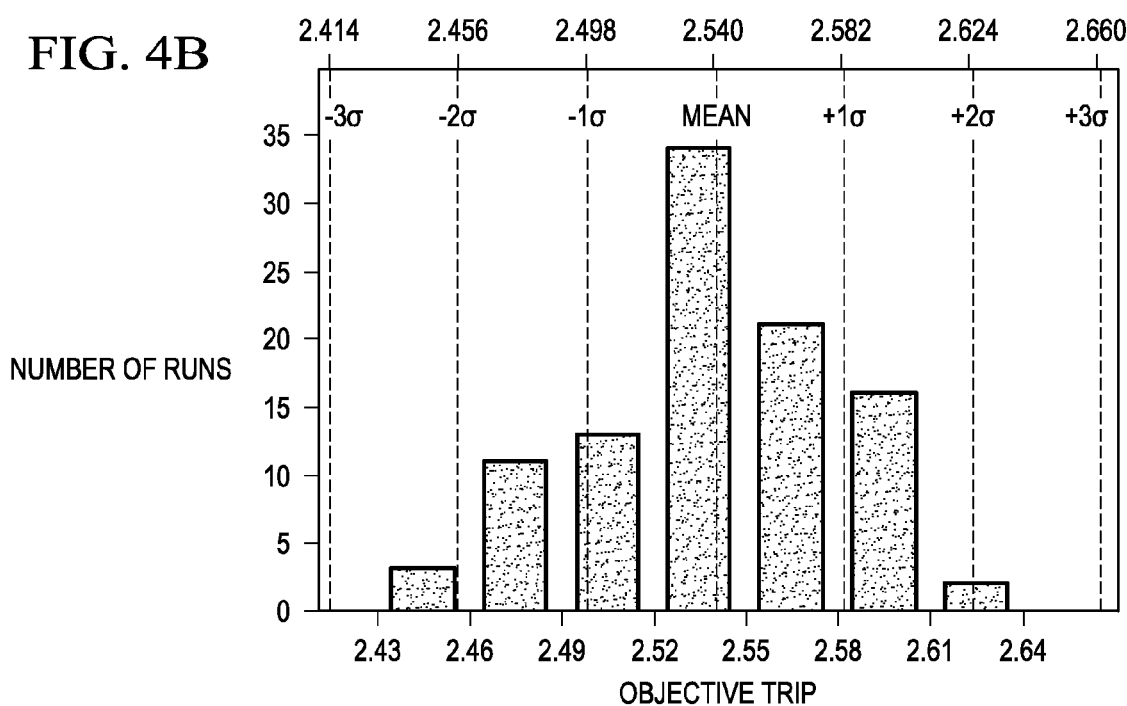
FIG. 4B illustrates in graphical form process and temperature variance data for a traditional BPOR.

FIG. 4A illustrate in graphical form process and temperature variance data for the POR 220 circuit, according to an embodiment. FIG. 4B illustrates in graphical form process and temperature variance data for the traditional BPOR 100. FIG. 4C illustrates in graphical form process and component mismatch variance data for the POR 220 circuit at −40, 27, 87 and 150 degrees Celsius temperatures, according to an embodiment. FIG. 4D illustrates in graphical form process and component mismatch variance data for the traditional BPOR 100 at −40, 27, 87 and 150 degrees Celsius temperatures.

Figure 1B:
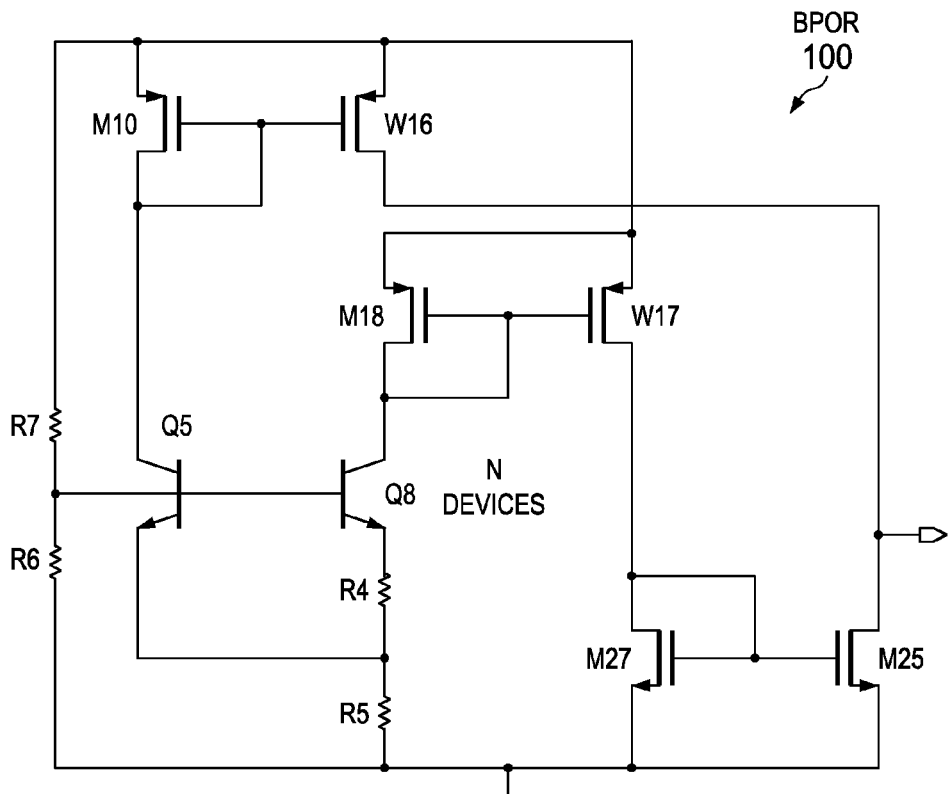
FIG. 1B is a diagram of a Brokaw cell based POR circuit, described herein above, according to prior art.

Referring to FIGS. 4A, 4B, 4C, and 4D, the performance of the POR 220 circuit may be benchmarked with the performance of the traditional BPOR 100 described with reference to FIG. 1. The traditional BPOR 100 deploys 4 resistors (2 matched pairs) and 3 current mirrors compared to 3 resistors and 1 current mirror for the POR 220 circuit. The performance of the traditional BPOR 100 includes 250 millivolts three sigma variation at room temperature, a silicon area of about 8000 square micro meters (including 5000 for BJT's and 2500 for resistors). The performance of the POR 220 circuit includes 213 millivolts three sigma variation at room temperature, a silicon area of about 7600 square micro meters (including 5000 for BJT's and 1700 for resistors). Even though the POR 220 circuit has a lower delta base-to-emitter voltage (a higher value is typically more immune to mismatch) the POR 220 circuit consumes less power and has less trip-point variation with a lower silicon area compared to the traditional BPOR 100. Thus, the POR 220 circuit provides less process and temperature variation and occupies less silicon area for the same power consumption as the BPOR 100. Other trade offs such as same silicon area but reduced temperature variation and reduce current are also possible with the POR 220 circuit, as described with reference to FIGS. 5A, 5B, 5C, and 5D. For a desired trip point voltage and a desired current consumption by the POR 220 circuit, a silicon area of the POR 220 circuit is smaller than a comparable silicon area for a BPOR having the same desired trip point voltage and the desired current consumption.

In addition, the POR 220 circuit provides additional headroom for the supply voltage compared to the BPOR 100 since the base voltage of the BJT's is base-to-emitter for the POR 220 and is bandgap voltage for the BPOR 100. That is, more supply voltage is available for the current mirrors for the POR 220 circuit compared to the traditional BPOR 100. Thus, it is preferred to use low threshold voltage PMOS devices for the current mirrors of the BPOR 100 to avail a lower gate-source voltage compared to the use of regular PMOS used in the POR 220 circuit.

Figure 5A:
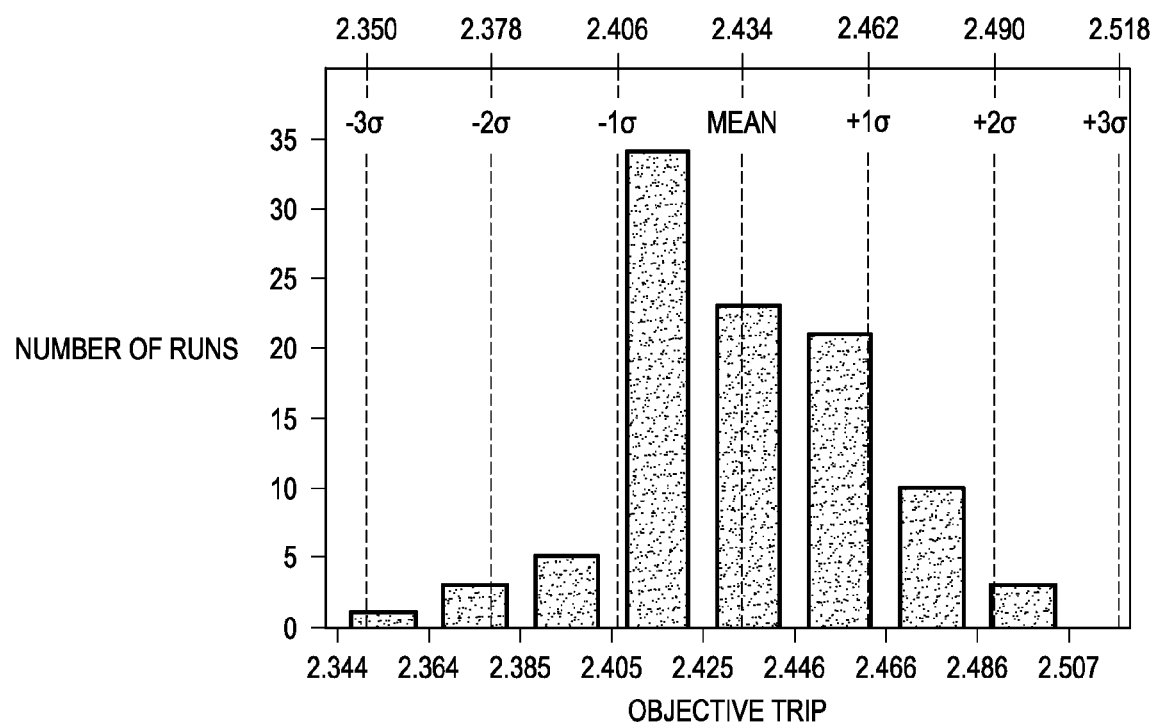
FIG. 5A illustrate in graphical form process and temperature variance data for a POR circuit that is optimized to reduce current and temperature variance for a desired silicon area, according to an embodiment.
Figure 5B:
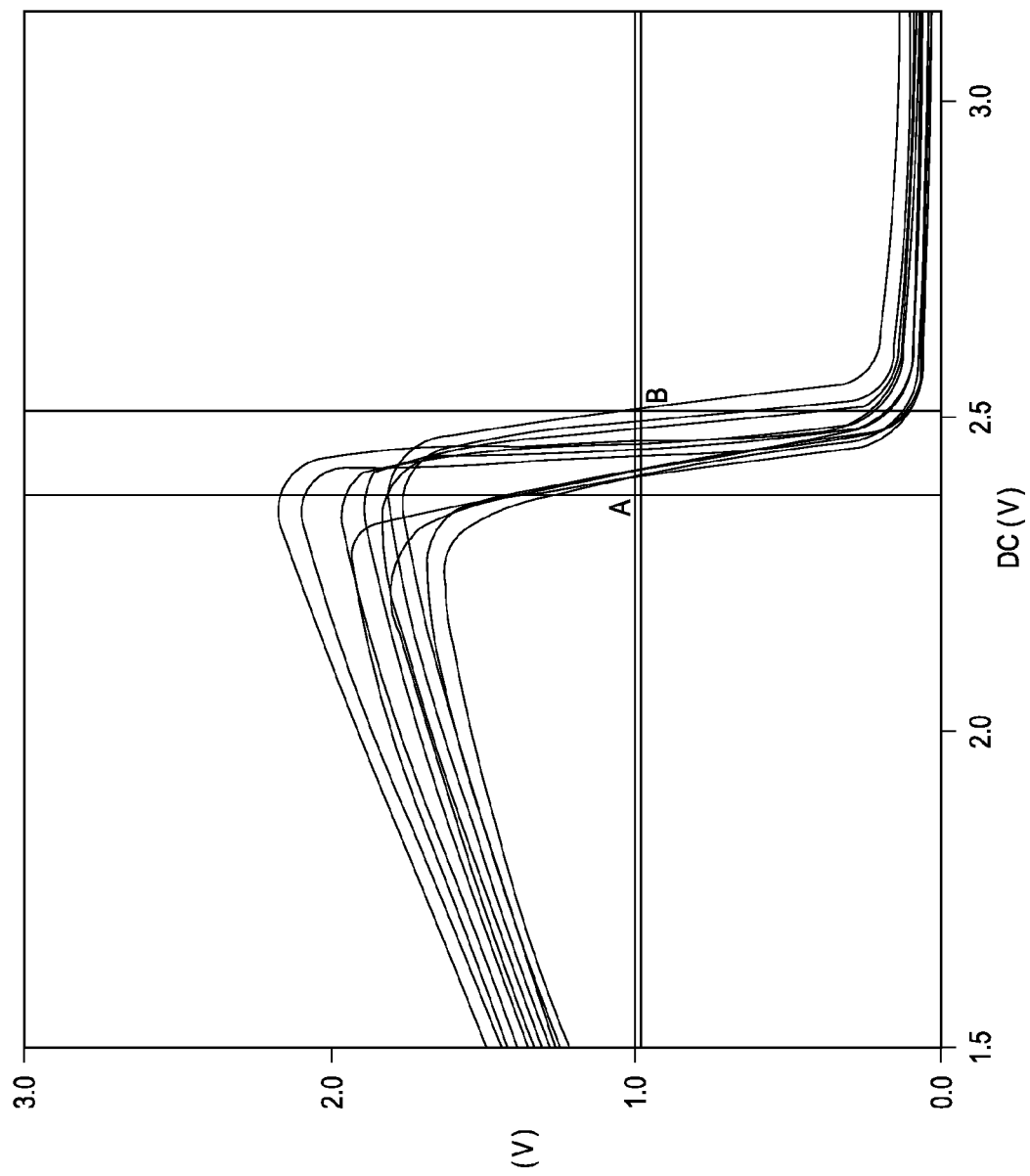
FIG. 5B illustrates in graphical form process and component mismatch variance data for a POR circuit that is optimized to reduce current and temperature variance for a desired silicon area at different temperatures, according to an embodiment.
Figure 5C:
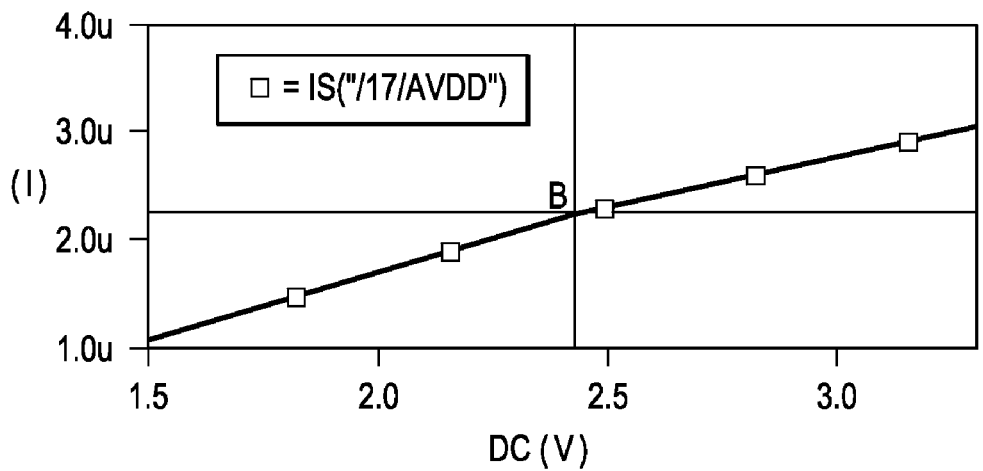
FIG. 5C illustrate in graphical current consumption data for a POR circuit that is optimized to reduce current and temperature variance for a desired silicon area, according to an embodiment.
Figure 5D:
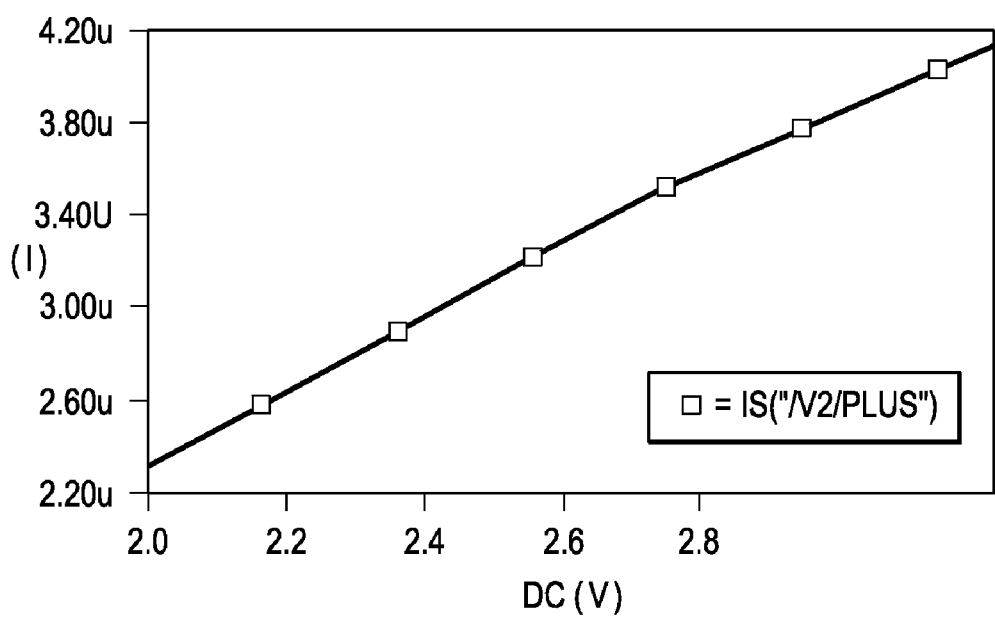
FIG. 5D illustrates in graphical form current consumption data for a traditional BPOR.

FIG. 5A illustrate in graphical form process and temperature variance data for the POR 220 circuit that is optimized to reduce current and temperature variance for the same silicon area as the BPOR 100, according to an embodiment. FIG. 5B illustrates in graphical form process and component mismatch variance data for the POR 220 circuit that is optimized to reduce current and temperature variance for the same silicon area as the BPOR 100 at −40, 27, 87 and 150 degrees Celsius temperatures, according to an embodiment. FIG. 5C illustrate in graphical form current consumption data for the POR 220 circuit that is optimized to reduce current and temperature variance for the same silicon area as the BPOR 100, according to an embodiment. FIG. 5D illustrates in graphical form current consumption data for the traditional BPOR 100.

Referring to FIGS. 5A, 5B, 5C, and 5D, the POR 220 is configured to have the same silicon area as the BPOR 100 but uses a reduced current and exhibits less temperature variation compared to the BPOR 100. The performance of the POR 220 circuit that is optimized to reduce current and temperature variance for the same silicon area as the BPOR 100 includes 173 millivolts three sigma variation at room temperature which is less than the 213 mV three sigma variation for the POR 220 circuit described with reference to FIG. 4A. In a particular embodiment, components of the POR 220 circuit are configured to have the following values at trip point: third resistor=105 kilo ohms, first and second resistors each=1.35 mega ohms, typical supply voltage=2.43 volts, N=6, and M=2. The BPOR 100 has a higher overall resistance compared to the overall resistance of the POR 220 circuit. In the BPOR 100 circuit, the PTAT current is defined by a 100K ohm resistor (coupled to the transistor having the greater emitter area) and, about 6 times that resistor (about 590K ohms) is required to achieve a bandgap-referenced operation. With the reduced overall resistance of the POR 220 circuit compared to the BPOR 100, the current consumption for the POR 220 is about 25% to 35% lower (depending on the selection of particular component values, dimensions, and similar other parameters) at the trip point compared to the BPOR 100, the POR 220 circuit and the BPOR 100 being configured to have a common desired trip point voltage. In a particular embodiment, at a desired trip point the current consumption for the POR 220 circuit is about 2.213 microamperes compared to 3.409 microamperes for the BPOR 100 circuit, thereby resulting in a 35% reduction.

Several advantages are achieved by the system according to the illustrative embodiments presented herein. The embodiments advantageously provide an improved POR circuit that deploys 3 resistors compared to the 4 resistors included in a traditional BPOR. The improved POR circuit advantageously provides tradeoffs between power consumption and silicon area compared to the traditional BPOR. The current consumption of the improved POR circuit is 25% lower compared to a current consumption of a BPOR, with the POR circuit and the BPOR being configured to have a common desired trip point voltage. For a desired trip point voltage and a desired current consumption by the POR circuit, a silicon area of the improved POR circuit is smaller than a comparable silicon area for a BPOR having the same desired trip point voltage and the desired current consumption.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of using circuits, those of ordinary skill in the art will appreciate that the apparatus and system disclosed herein are capable of being implemented as integrated circuit chips. As another example, the BJT's described herein may be implemented by using any diode-like element that exhibits a diode voltage drop (including diodes and CMOS transistors operating in the subthreshold region).

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A power on reset (POR) circuit comprising:
   a supply voltage;
   a current mirror coupled to the supply voltage, the current mirror operable to provide a pair of matching currents;
   a resistor divider disposed between the supply voltage and a voltage reference, the resistor divider comprising a first resistor disposed between the supply voltage and a first node and a second resistor disposed between the first node and the voltage reference;
   a pair of transistors coupled to receive a corresponding one of the pair of matching currents, the pair of transistors having their bases coupled to the first node, a collector of a first transistor of the pair of transistors providing an output voltage in response to the supply voltage;
   a third resistor disposed between an emitter of a second transistor of the pair of transistors and the voltage reference; and
   a third transistor having a base and a collector coupled to the first node and an emitter coupled to the voltage reference.

2. The POR circuit of claim 1, wherein the output voltage is at a first voltage level in response to the first node being below a bandgap referenced voltage, wherein the output voltage level is at a second voltage level in response to the first node being equal to the bandgap referenced voltage, wherein the output voltage level is at a third voltage level in response to the first node being greater than the bandgap referenced voltage.

3. The POR circuit of claim 2, wherein at least one of the first voltage level and the third voltage level is configurable to be greater than 1.2 volts.

4. The POR circuit of claim 1, wherein an area of the emitter of the second transistor is N times an area of the emitter of the first transistor, N being configured as an integer.

5. The POR circuit of claim 1, wherein an area of the emitter of the third transistor is M times an area of the emitter of the first transistor, M being configured as an integer.

6. The POR circuit of claim 5, wherein the supply voltage at a trip point is computed as a function of the first resistor, the second resistor, the third resistor, the value of M, and a difference between base-to-emitter voltage of the first and second transistors.

7. The POR circuit of claim 6, wherein the supply voltage at the trip point is a multiple of a bandgap reference voltage.

8. The POR circuit of claim 1, wherein the third transistor is non-conducting in response to the supply voltage being below a threshold level, wherein the third transistor begins conducting in response to the supply voltage being equal to the threshold level, wherein the third transistor is conducting in response to the supply voltage being greater than the threshold level.

9. The POR circuit of claim 1, wherein a current flowing through the first transistor is equal to a current flowing through a second transistor at a trip point.

10. The POR circuit of claim 1, wherein at a trip point the third transistor is operable to provide a current that is proportional to absolute temperature (PTAT).

11. The POR circuit of claim 1, wherein the output voltage changes in response to a brown out condition, the brown out condition causing the supply voltage to drop to a level below a threshold after the supply voltage reaches a desired voltage level.

12. The POR circuit of claim 1, wherein the current flowing through the second transistor is greater than the current flowing through the first transistor in response to the supply voltage being less than a threshold level, wherein the current flowing through the second transistor is equal to the current flowing through the first transistor in response to the supply voltage being equal to the threshold level, wherein the current flowing through the second transistor is less than the current flowing the first transistor in response to the supply voltage being greater than the threshold level.

13. An electronic system comprising:
    a power supply operable to provide a supply voltage;
    a power on reset (POR) circuit coupled to receive the supply voltage and provide an output voltage in response to the supply voltage, wherein the POR circuit includes:
      a current mirror coupled to the supply voltage, the current mirror operable to provide a pair of matching currents;
      a resistor divider disposed between the supply voltage and a voltage reference, the resistor divider comprising a first resistor disposed between the supply voltage and a first node and a second resistor disposed between the first node and the voltage reference;
      a pair of transistors coupled to receive a corresponding one of the pair of matching currents, the pair of transistors having their bases coupled to the first node, a collector of a first transistor of the pair of transistors providing the output voltage;
      a third resistor disposed between an emitter of a second transistor of the pair of transistors and the voltage reference;
      a third transistor having a base and a collector coupled to the first node and an emitter coupled to the voltage reference; and
    an electronic device enabled to receive the supply voltage in response to a change of state of the output voltage.

14. The electronic system of claim 13, wherein the electronic device is selectable to be one of a processor, a memory, a micro controller, and a radio frequency integrated circuit.

15. The electronic system of claim 13, wherein an area of the emitter of the third transistor is M times an area of the emitter of the first transistor, M being configured as an integer.

16. The electronic system of claim 13, wherein the supply voltage at a trip point is computed as a function of the first resistor, the second resistor, the third resistor, the value of M, and a difference between base-to-emitter voltage of the first and second transistors.

17. The electronic system of claim 16, wherein the supply voltage at the trip point is a multiple of a bandgap referenced voltage.

18. The electronic system of claim 13, wherein the third transistor is non-conducting in response to the supply voltage being below a threshold level, wherein the third transistor begins conducting in response to the supply voltage being equal to the threshold level, wherein the third transistor is conducting in response to the supply voltage being greater than the threshold level.

19. The electronic system of claim 13, wherein a current flowing through the first transistor is equal to a current flowing through a second transistor at a trip point.

20. The electronic system of claim 13, wherein a current flowing through the third transistor is M times a current flowing thorough the first transistor, M being configured as an integer.

* * * * *